United States Patent
Choi et al.

(10) Patent No.: US 9,958,509 B2
(45) Date of Patent: May 1, 2018

(54) CHARGER HAVING BATTERY DIAGNOSIS FUNCTION AND METHOD OF DRIVING THE SAME

(71) Applicant: FOUNDATION OF SOONGSIL UNIVERSITY—INDUSTRY COOPERATION, Seoul (KR)

(72) Inventors: Woojin Choi, Seoul (KR); Moonsik Choi, Gimcheon-si (KR)

(73) Assignee: Foundation of Soongsil University-Industry Cooperation, Seoul (KR)

(*) Notice: Subject to any disclaimer, the term of this patent is extended or adjusted under 35 U.S.C. 154(b) by 155 days.

(21) Appl. No.: 15/155,691

(22) Filed: May 16, 2016

(65) Prior Publication Data
US 2016/0349331 A1    Dec. 1, 2016

(30) Foreign Application Priority Data

May 29, 2015    (KR) .................. 10-2015-0076673
Sep. 1, 2015    (KR) .................. 10-2015-0123687

(51) Int. Cl.
| H02J 7/00 | (2006.01) |
| H02J 7/14 | (2006.01) |
| G01R 31/36 | (2006.01) |

(52) U.S. Cl.
CPC ..... *G01R 31/3679* (2013.01); *G01R 31/3662* (2013.01); *H02J 7/0029* (2013.01);
(Continued)

(58) Field of Classification Search
USPC ........ 320/104, 105, 106, 107, 108, 109, 110
See application file for complete search history.

(56) References Cited

U.S. PATENT DOCUMENTS 5,321,389 A * 6/1994 Meister ............... H02J 9/002
                                                 307/10.7
5,559,719 A * 9/1996 Johnson ............... G01R 23/10
                                                 324/520

(Continued)

FOREIGN PATENT DOCUMENTS

KR    10-2011-0124204 A    11/2011
KR    10-2011-0131805 A    12/2011
(Continued)

*Primary Examiner* — Alexis Pacheco
(74) *Attorney, Agent, or Firm* — Novick, Kim & Lee, PLLC; Sang Ho Lee

(57) ABSTRACT

Provided herein is a charger having a battery diagnosis function. The charger is connected between an input power supply supplying an input voltage and a battery and charges the battery with the input voltage. The charger includes a full-bridge-circuit connected to the input power supply and comprising a first switch, a second switch, a third switch, and a fourth switch, a transformer including a primary winding and a secondary winding, wherein the primary winding is connected to the full-bridge-circuit to transform the input voltage received from the full-bridge-circuit and transmits the voltage to the secondary winding, and a rectifying circuit comprising a fifth switch and a sixth switch, connected between the secondary winding and the battery, and rectifying the voltage received from the transformer to charge the battery, or transmitting power in two directions for diagnosing a state-of-health of the battery.

11 Claims, 10 Drawing Sheets

(52) U.S. Cl.
CPC .......... *H02J 7/0042* (2013.01); *H02J 7/0047* (2013.01); *H02J 7/0068* (2013.01); *H02J 2007/0059* (2013.01)

(56) References Cited

U.S. PATENT DOCUMENTS

| | | | |
|---|---|---|---|
| 2006/0103351 A1* | 5/2006 | Tanigawa | H02J 7/0016 320/118 |
| 2010/0123434 A1* | 5/2010 | Iwata | H02J 7/0016 320/118 |
| 2013/0057200 A1 | 3/2013 | Potts et al. | |

FOREIGN PATENT DOCUMENTS

| | | |
|---|---|---|
| KR | 10-1191137 B1 | 11/2012 |
| KR | 10-2013-0034028 A | 4/2013 |
| KR | 10-1295420 B1 | 8/2013 |
| KR | 10-1490928 B1 | 2/2015 |

\* cited by examiner

SECOND OPERATIONAL MODE

FOURTH OPERATIONAL MODE

FIFTH OPERATIONAL MODE

SIXTH OPERATIONAL MODE

SEVENTH OPERATIONAL MODE

CHARGER HAVING BATTERY DIAGNOSIS FUNCTION AND METHOD OF DRIVING THE SAME

CROSS-REFERENCE TO RELATED APPLICATION

This application claims priority to and the benefit of Korean Patent Application Nos. 10-2015-0076673 and 10-2015-0123687, filed on May 29, 2015 and Sep. 1, 2015, respectively, the disclosures of which are incorporated herein by reference in their entirety.

BACKGROUND

1. Field of the Disclosure

The present disclosure relates to a charger having a battery diagnosis function and a method of driving the same, and more particularly, to a charger capable of diagnosing a state-of-health and an abnormal state of a battery and a method of driving the same.

2. Discussion of Related Art

Typically, a battery performs a discharge cycle for converting chemical energy into electrical energy and a charge cycle for converting electrical energy into chemical energy. A most common battery is a lead storage battery as an application of a galvanic battery, which is comprised of a sulfuric acid solution, a lead (Pb) electrode, and a lead dioxide ($PbO_2$) electrode, and a state-of-health thereof is shortened due to many different kinds of aging process including variation in internal active materials and a self-discharge which is caused by repetitive charge and discharge cycles for a long time.

Meanwhile, the battery described above is periodically charged with electric power through a charger. Generally, such a charger is not provided with a function capable of diagnosing a status of a battery, aside from a battery charge function. As a result, a user can not recognize a state-of-health of a battery upon use of the battery to get a forecast regarding an inoperable state or an indication of malfunction of a system caused by the sudden drop of the battery's state-of-health, such that reliability of the system may be degraded.

To address such a problem, research on a charger capable of diagnosing the state-of-health of a battery upon charging the battery and informing a user of the diagnosis result have actively been conducted.

Calculating a maximum available capacity of a battery using a Coulomb coefficient thereof and on the basis of a parameter variation of a battery model, methods of diagnosing a state-of-health of a battery are representative.

The methods described above, however, are disadvantageous in that a diagnosis algorithm of a battery's state-of-health is both complicated and becoming less reliable.

SUMMARY OF THE DISCLOSURE

Therefore, in accordance with an aspect of the present disclosure, a charger having a simplified battery diagnosis algorithm and configured to apply a perturbation voltage to a battery and to diagnose a state-of-health thereof based on a response current according to the perturbation voltage using a charger capable of bidirectionally transmitting power, and a method of driving the same are provided.

In accordance with one aspect of the present disclosure, a charger having a battery diagnosis function, which is connected between an input power supply for supplying an input voltage and a battery to charge the battery with the input voltage, includes a full-bridge-circuit connected to the input power supply and including a first switch, a second switch, a third switch, and a fourth switch, a transformer including a primary winding and a secondary winding, the primary winding being connected to the full-bridge-circuit and transforming the input voltage received from the full-bridge-circuit to transmit the voltage to the secondary winding, and a rectifying circuit including a fifth switch and a sixth switch, which are connected between the secondary winding and the battery, and are configured to rectify the voltage received from the transformer to charge the battery, or to bidirectionally transmit electrical power so as to diagnose the state-of-health of the battery.

Meanwhile, a controller configured to control a plurality of switches including the first switch to the sixth switch to charge the battery with the input voltage or apply a perturbation voltage for diagnosing the state-of-health of the battery, and to diagnose the state-of-health of the battery based on a response current output from the battery according to the perturbation voltage may be further included.

Also, the full-bridge-circuit may include a first leg and a second leg connected in parallel with each other, wherein the first switch and the second switch may be provided at the first leg, and the third switch and the fourth switch may be provided at the second leg.

Further, each switch of the first switch to the fourth switch may be provided with a parasitic capacitor and a body diode connected in parallel with each other.

Furthermore, the transformer may be provided with a tap at the secondary winding thereof.

In addition, a smoothing circuit connected to the tap provided at the secondary winding may be further included.

Moreover, the rectifying circuit may include the sixth switch connected to one end of the secondary winding, and the fifth switch connected to the other end of the secondary winding.

Additionally, each switch of the fifth switch and the sixth switch may be provided with a parasitic capacitor and a body diode connected in parallel with each other.

Also, the first switch to the fourth switch may be turned on by a zero voltage switching (ZVS).

In accordance with another aspect of the present disclosure, a method of driving a charger having a battery diagnosis function and including a full-bridge-circuit for receiving an input power and having a first switch to a fourth switch, a transformer having a primary winding and a secondary winding, the primary winding being connected to the full-bridge-circuit and transforming an input voltage received from the full-bridge-circuit to transmit the voltage to the secondary winding, a fifth switch and a sixth switch, and a rectifying circuit connected to the secondary winding to rectify the voltage received from the transformer to charge the battery, includes transmitting the input power to the transformer according to turn-on or turn-off operations of the first switch to the fourth switch, rectifying the input voltage to charge the battery according to turn-on or turn-off operations of the fifth switch and the sixth switch, applying a perturbation voltage to the battery when a charge of the battery is completed, and diagnosing a state-of-health of the battery based on a response current output therefrom.

Meanwhile, the transmitting of the input power to the transformer according to turn-on or turn-off operations of the first switch to the fourth switch may be operated by a ZVS when the first switch to the fourth switch are turned on, thereby transmitting the input power to the transformer.

Also, the rectifying of the input voltage to charge the battery according to turn-on or turn-off operations of the fifth switch and the sixth switch may include connecting the sixth switch to one end of the secondary winding and the fifth switch to the other end of the secondary winding, wherein the full-bridge-circuit may include a first leg and a second leg connected in parallel with each other, turning on the fifth switch when the first switch provided in a top of the first leg or the fourth switch provided in a bottom of the second leg is turned on, turning off the fifth switch when the first switch and the fourth switch are turned off, turning on the sixth switch when the second switch is in a bottom of the first leg or the third switch in a top of the second leg is turned on, and turning off the sixth switch when the second switch and the third switch are turned off so as to rectify the input voltage, thereby charging the battery.

In addition, each switch of the first switch to the sixth switch may include a parasitic capacitor and a body diode, which are connected in parallel to each other.

Additionally, transmitting power bidirectionally according to turn-on or turn-off operations of the fifth switch and the sixth switch may be further included.

According to one aspect of the present disclosure described above, using the charger capable of bidirectionally transmitting power, a state-of-health of the battery may be diagnosed simply and precisely through an algorithm which applies a perturbation voltage to the battery and diagnoses the state-of-health thereof based on a response current according to the perturbation voltage.

In addition, a plurality of switches included in the charger is operated by the ZVS such that a total loss of the charger due to a decrease of a switch loss may be reduced.

Additionally, the rectifying circuit included in the charger performs a synchronized rectification such that a conduction loss may be reduced.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
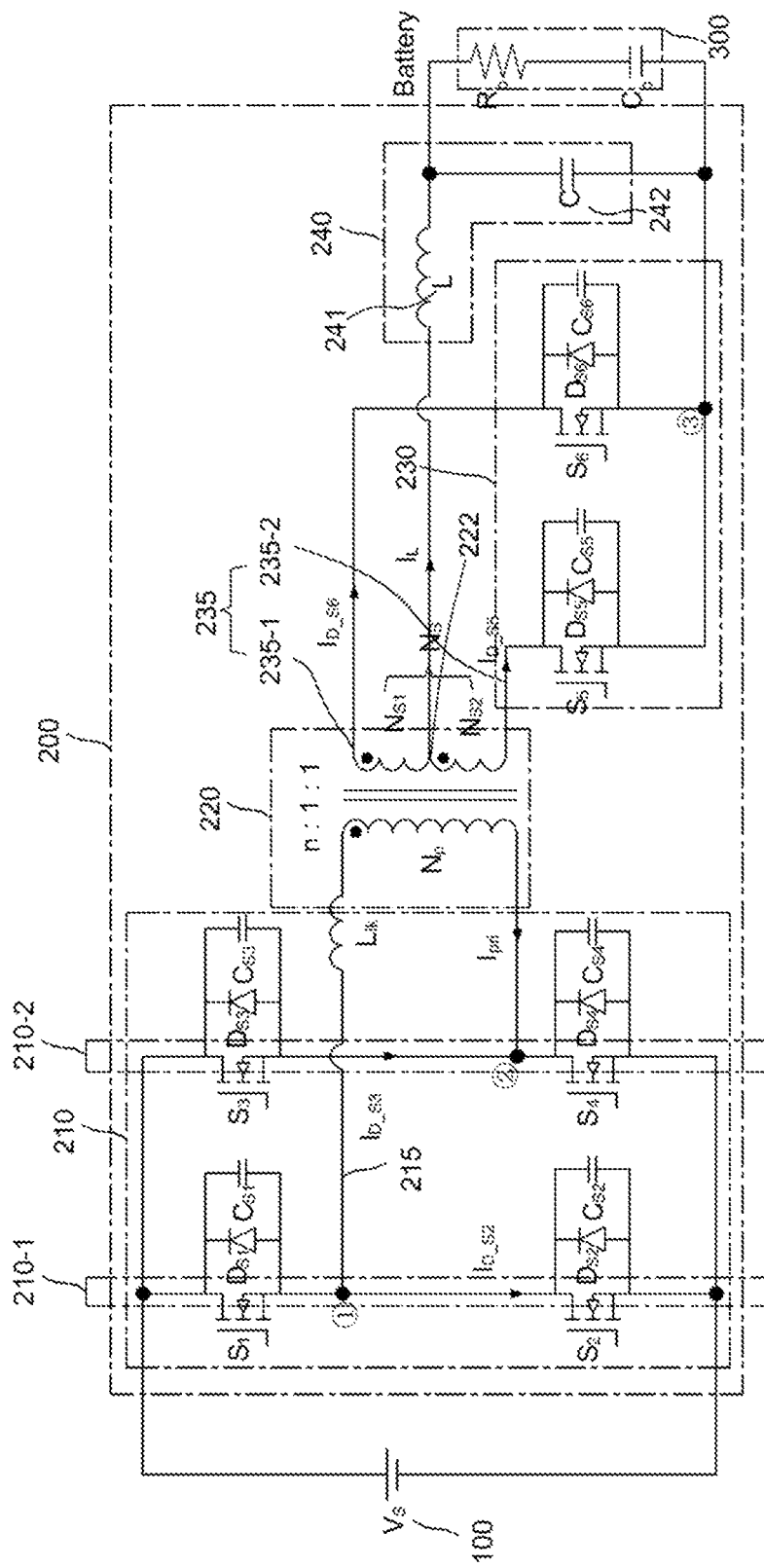
FIG. 1 is a schematic circuit diagram of a charger having a battery diagnosis function according to one embodiment of the present disclosure.

Description of the present disclosure will be described with reference to the accompanying drawings which illustratively show embodiments implementable by the present disclosure as examples. These embodiments will be fully described in detail suitable for implementation by those skilled in the art. Various embodiments of the present disclosure are different to each other, but it should be understood that they do not need to be mutually exclusive. For example, specific shapes, structures, and features disclosed herein may be implemented by another embodiment in association with one embodiment without departing from the spirit and scope of the present disclosure. Also, it should be understood that positions and arrangements of respective components disclosed in each embodiment may be modified without departing from the spirit and scope of the present disclosure. The embodiments to be disclosed later, therefore, are not to be taken in a sense for limiting the scope of the present disclosure but for explanation thereof, and the range of the scope is not limited to these embodiments. The scope of the present disclosure should be construed by the appended claims, along with the full range of equivalents to which such claims are entitled. In giving reference numerals to components of the drawings, the same or similar reference numerals are given to components having the same or similar functions throughout various aspects. Terms used herein are for descriptive purposes only and are not intended to limit the scope of the invention. The terms "comprises" and/or "comprising" are used to specify the presence of stated elements, steps, operations, and/or components, but do not preclude the presence or addition of one or more other elements, steps, operations, and/or components. The terms "first," "second," and the like may be used to describe various elements, but do not limit the elements. Such terms are only used to distinguish one element from another. These and/or other aspects become apparent and are more readily appreciated by those of ordinary skill in the art from the following description of embodiments of the present invention, taken in conjunction with the accompanying drawings.

Hereinafter, preferable embodiments of the present disclosure will be described in detail with reference to the accompanying drawings.

FIG. 1 is a schematic circuit diagram of a charger having a battery diagnosis function according to one embodiment of the present disclosure.

With reference to FIG. 1, a charger 200 having a battery diagnosis function (hereinafter, referred to as a charger) according to one embodiment of the present disclosure is connected between an input power supply 100 and a battery 300, and may include a full-bridge-circuit 210, a transformer 220, a rectifying circuit 230, and a smoothing circuit 240.

The charger 200 according to one embodiment of the present disclosure may charge the battery 300 using a constant-current and constant-voltage (CC/CV) charge method, and may diagnose a state-of-health of the battery 300 through electrochemical impedance spectroscopy (EIS).

In particular, the charger 200 according to one embodiment of the present disclosure may charge the battery 300 of high capacity, for example, a 3 kW lead-acid cell type battery 300. The battery 300 includes an internal resistance $R_b$ and an internal capacity $C_b$, and embodiments of the present disclosure may be applicable to any type of a battery in addition to the type of the battery described above.

The full-bridge-circuit 210 may include a plurality of switches $S_1$, $S_2$, $S_3$, and $S_4$, and may be connected to the input power supply 100 to transmit an input voltage $V_s$ supplied from the input power supply 100 to the transformer 220.

In particular, the full-bridge-circuit 210 may include a first leg 210-1 and a second leg 210-2 connected in parallel with each other. A first switch S1 may be provided in a top of the first leg 210-1, and a second switch S2 may be provided in a bottom of the first leg 210-1. In addition, a third switch S3 may be provided in a top of the second leg 210-2, and a fourth switch S4 may be provided in a bottom of the second leg 210-2.

At this point, the plurality of switches $S_1$, $S_2$, $S_3$, and $S_4$ may be provided as a bipolar junction transistor (BJT), a junction field effect transistor (JFET), a metal oxide semiconductor FET (MOSFET), and the like, and examples of the plurality of switches $S_1$, $S_2$, $S_3$, and $S_4$ provided as an MOSFET will be described below. Also, a first body diode $D_{S1}$ to a fourth body diode $D_{S4}$ and a first parasitic capacitor $C_{S1}$ to a fourth parasitic capacitor $C_{S4}$ may be connected in parallel to be added to the plurality of switches $S_1$, $S_2$, $S_3$, and $S_4$. As one example, a drain terminal of the first switch $S_1$ may be connected to a cathode of the first body diode $D_{S1}$ and one end of the first parasitic capacitor $C_{S1}$, and a source terminal of the first switch $S_1$ may be connected to an anode of the first body diode $D_{S1}$ and the other end of the parasitic capacitor $C_{S1}$. In such a way described above, the second body diode $D_{S2}$ to the fourth body diode $D_{S4}$ and the second parasitic capacitor $C_{S2}$ to the fourth parasitic capacitor $C_{S4}$ may be connected in parallel with each other in the second switch $S_2$ to the fourth switch $S_4$.

The transformer 220 may include a primary winding $N_P$ and a secondary winding $N_S$, and may be connected between the full-bridge-circuit 210 and the rectifying circuit 230 to perform a voltage conversion according to a turns ratio (n:1:1) of the transformer 220. At this point, the transformer 220 may be an isolation transformer to isolate the full-bridge-circuit 210 from the rectifying circuit 230.

In particular, the primary winding $N_P$ may be magnetically coupled to the secondary winding $N_S$, and may be provided at an input voltage line 215 connecting a first contact point ① between the first switch $S_1$ and the second switch $S_2$ to a second contact point ② between the third switch $S_3$ and the fourth switch $S_4$.

The secondary winding $N_S$ may be magnetically coupled to the primary winding $N_P$, and may be provided at an output voltage line 235 connected to the rectifying circuit 230. At this point, the secondary winding $N_S$ may be provided with a tap 222 for dividing an output of the transformer 220 to be divided into a first secondary winding $N_{S1}$ and a second secondary winding $N_{S2}$.

The rectifying circuit 230 may include a fifth switch $S_5$ and a sixth switch $S_6$, and may rectify the output of the transformer 220 to transmit the rectified output to the smoothing circuit 240.

In particular, the sixth switch $S_6$ of the rectifying circuit 230 may be provided at a first output voltage line 235-1 connected to one end of the secondary winding $N_S$ of the transformer 220, and the fifth switch $S_5$ thereof may be provided at a second output voltage line 235-2 connected to the other end of the secondary winding $N_S$. In other words, one end of the sixth switch $S_6$ may be connected to the one end of the secondary winding $N_S$, one end of the fifth switch $S_5$ may be connected to the other end of the secondary winding $N_S$, and the other ends of the sixth switch $S_6$ and the fifth switch $S_5$ may be connected to a third contact point ③.

At this point, the fifth switch $S_5$ and the sixth switch $S_6$ may be provided as a BJT, a JFET, an MOSFET, and the like, and examples of the fifth switch $S_5$ and the sixth switch $S_6$ provided as an MOSFET will be described below. Also, a fifth body diode $D_{S5}$ and a sixth body diode $D_{S6}$, and a fifth parasitic capacitor $C_{S5}$ and a sixth parasitic capacitor $C_{S6}$ may be connected in parallel to be added to the fifth switch $S_5$ and the sixth switch $S_6$.

The smoothing circuit 240 may include an output inductor 241 and an output capacitor 242, and smooth the output voltage rectified by the rectifying circuit 230 to output the smoothed voltage to the battery 300.

In particular, one end of the output inductor 241 may be connected to the tap 222 of the secondary winding $N_S$, the other end thereof may be connected to one end of the output capacitor 242, and the other end of the output capacitor 242 may be connected to the third contact point ③. And, the output capacitor 242 may be connected in parallel with the battery 300.

As described above, the charger 200 according to one embodiment of the present disclosure may charge the battery 300 by converting the input voltage $V_S$ supplied from the input power supply 100 through the transformer 220.

Here, a primary side of the transformer 220 may be connected to the full-bridge-circuit 210 to receive the input voltage $V_S$ from the input power supply 100 according to switching operations of the plurality of switches $S_1$, $S_2$, $S_3$, and $S_4$ included in the full-bridge-circuit 210. At this point, the plurality of switches $S_1$, $S_2$, $S_3$, and $S_4$ may be switched by a separate controller (not shown) such as a digital signal processor using a pulse width modulation (PWM) control method, and may be turned on in a zero voltage switching method (ZVS) by a resonant loop formed through a leakage inductance $L_{lk}$ of the transformer 220 and the first parasitic capacitor $C_{S1}$ to the fourth parasitic capacitor $C_{S4}$ added to the plurality of switches $S_1$, $S_2$, $S_3$, and $S_4$ respectively.

In addition, a secondary side of the transformer 220 may be connected to the rectifying circuit 230 and the smoothing circuit 240 to rectify the voltage received from the primary side of the transformer 220 using a full wave rectification method and to charge the battery 300. At this point, since the plurality of switches $S_5$ and $S_6$ are provided in the rectifying circuit 230, bidirectional power transfer may be possible such that a state-of-health of the battery 300 may be diagnosed through EIS. Similarly, the plurality of switches $S_5$ and $S_6$ of the rectifying circuit 230 may be switched by a separate controller (not shown) such as a digital signal processor using a PWM control method.

A separate controller such as a digital signal processor may be provided inside or outside a circuitry of the charger 200, and may be electrically connected to each element inside the circuitry thereof to control turn-on and turn-off operations of the plurality of switches $S_1$, $S_2$, $S_3$, $S_4$, $S_5$, and $S_6$ by software (or application) for use in a switching.

In other words, the controller may charge the battery 300 with the input voltage $V_S$, control the first switch $S_1$ to the sixth switch $S_6$ so as to apply a perturbation voltage for use in diagnosing a state-of-health of the battery 300, and diagnose the state-of-health of the battery 300 based on a response current output therefrom according to the perturbation voltage. A detailed description related thereto will be described below.

Hereinafter, a detailed driving method of the charger 200 according to one embodiment of the present disclosure will be described with reference to FIGS. 2 to 6.

Figure 2:
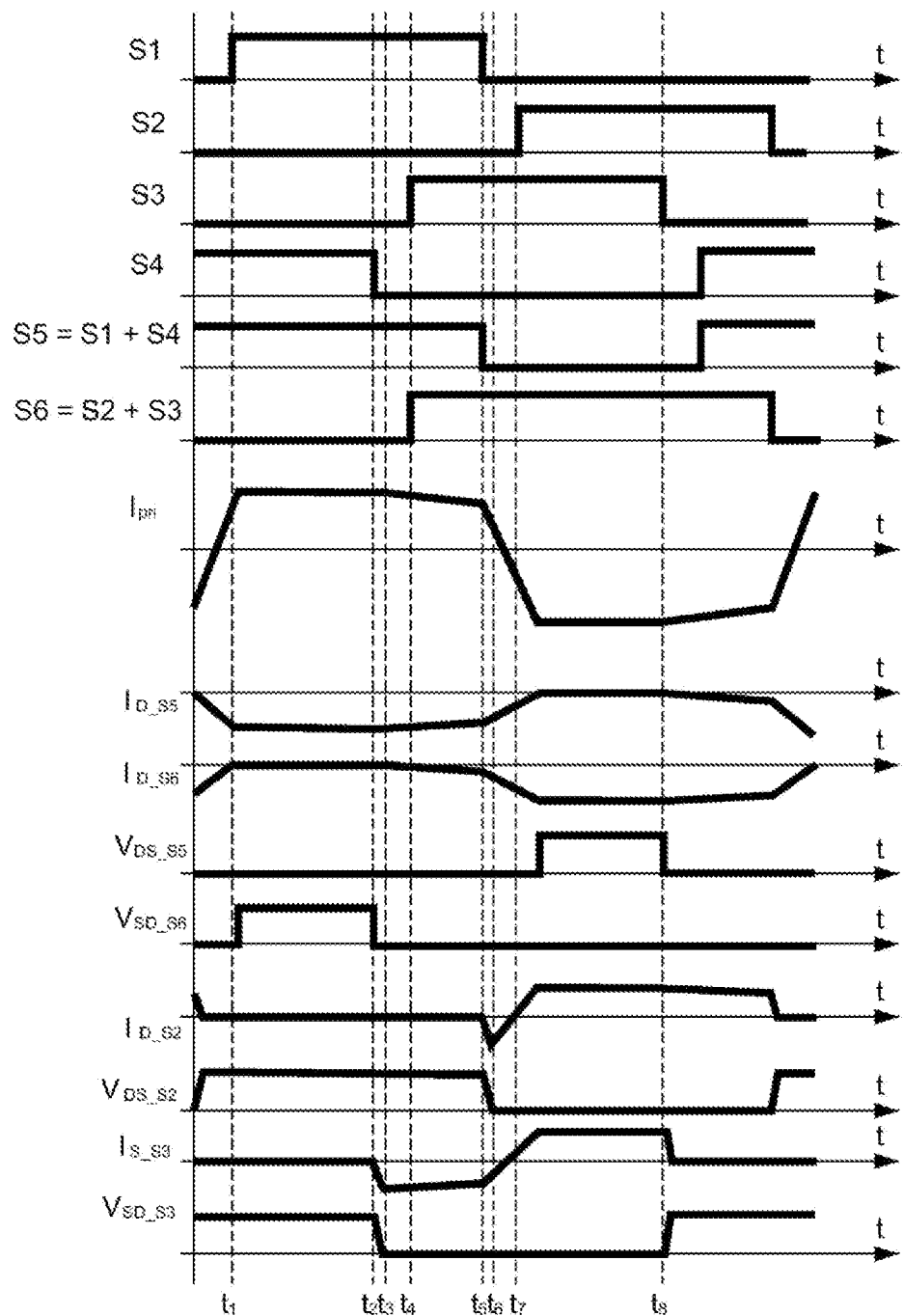
FIG. 2 is a graph illustrating currents flowing in elements and voltages applied thereto in a first operational mode to a seventh operational mode of the charger having the battery diagnosis function according to one embodiment of the present disclosure.

FIG. 2 is a graph illustrating currents flowing in elements and voltages applied thereto in a first operational mode to a seventh operational mode of the charger according to one embodiment of the present disclosure, and FIGS. 3 to 9 are schematic circuit diagrams for describing the first operational mode to the seventh operational mode of the switches according to one embodiment of the present disclosure.

Now with reference to FIG. 2, the first switch $S_1$ to the sixth switch $S_6$ may be switched by a phase-shifted PWM control method. At this point, the first switch $S_1$ to the sixth switch $S_6$ may be controlled by a separate controller (not shown) such as a digital signal processor.

Also, the fifth switch $S_5$ may be controlled to be turned on when at least one of the first switch $S_1$ and the fourth switch $S_4$ is turned on, and to be turned off when both of the first switch $S_1$ and the fourth switch $S_4$ are turned off.

Moreover, the sixth switch $S_6$ may be controlled to be always turned on when at least one of the second switch $S_2$ and the third switch $S_3$ is turned on, and to be turned off when both of the second switch $S_2$ and the third switch $S_3$ are turned off.

Figure 3:
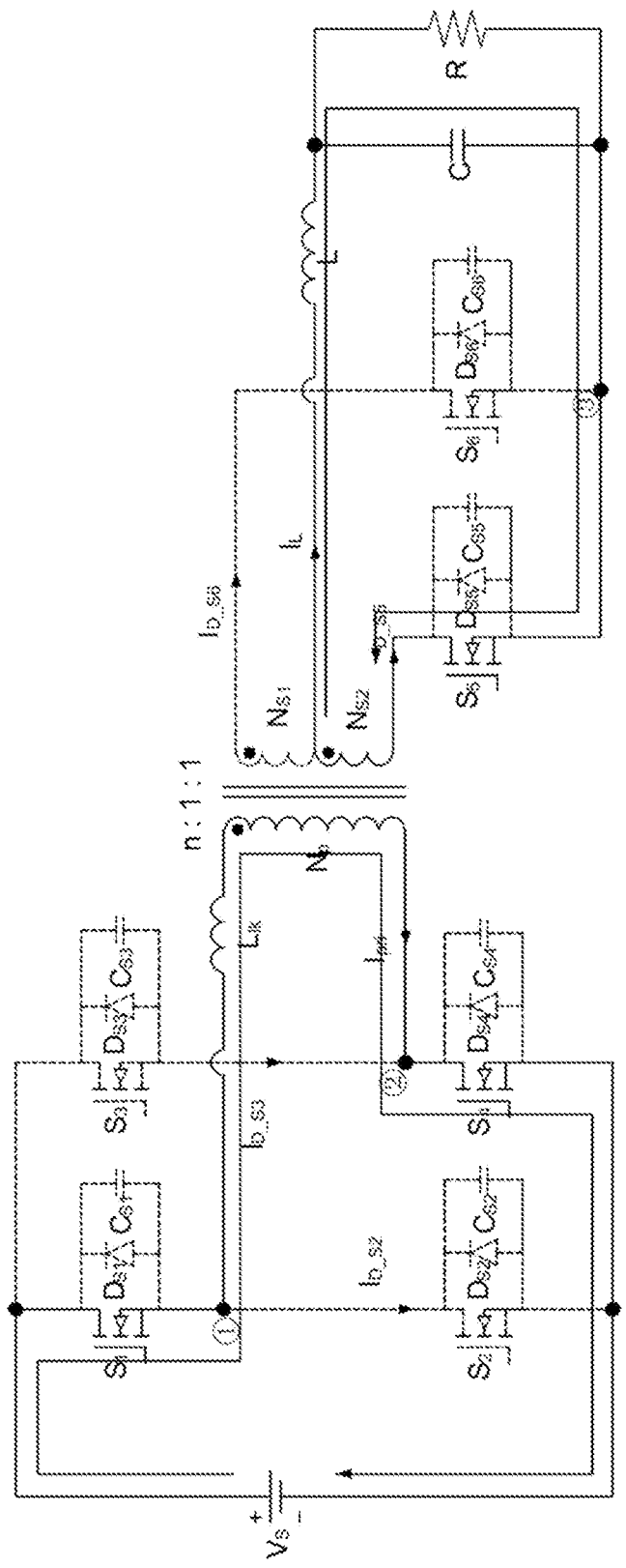
FIGS. 3 to 9 are schematic circuit diagrams for describing the first operational mode to the seventh operational mode of the charger having the battery diagnosis function according to one embodiment of the present disclosure.

With reference to FIGS. 2 and 3, in a first operational mode during $t_1$ to $t_2$, the first switch $S_1$ and the fourth switch $S_4$ are in a turn-on state and the second switch $S_2$ and the third switch $S_3$ are in a turn-off state, such that the fifth switch $S_5$ may be in a turn-on state and the sixth switch $S_6$ may be in a turn-off state.

In the first operational mode, a primary-side current $I_{pri}$ of the transformer 220 may increase according to a total inductance value of the primary side of the transformer 220.

Further, according to a turn-on operation of the fifth switch $S_5$, a voltage transformed from the primary winding $N_P$ to the second secondary winding $N_{S2}$ may be induced on the secondary side of the transformer 220.

Figure 4:
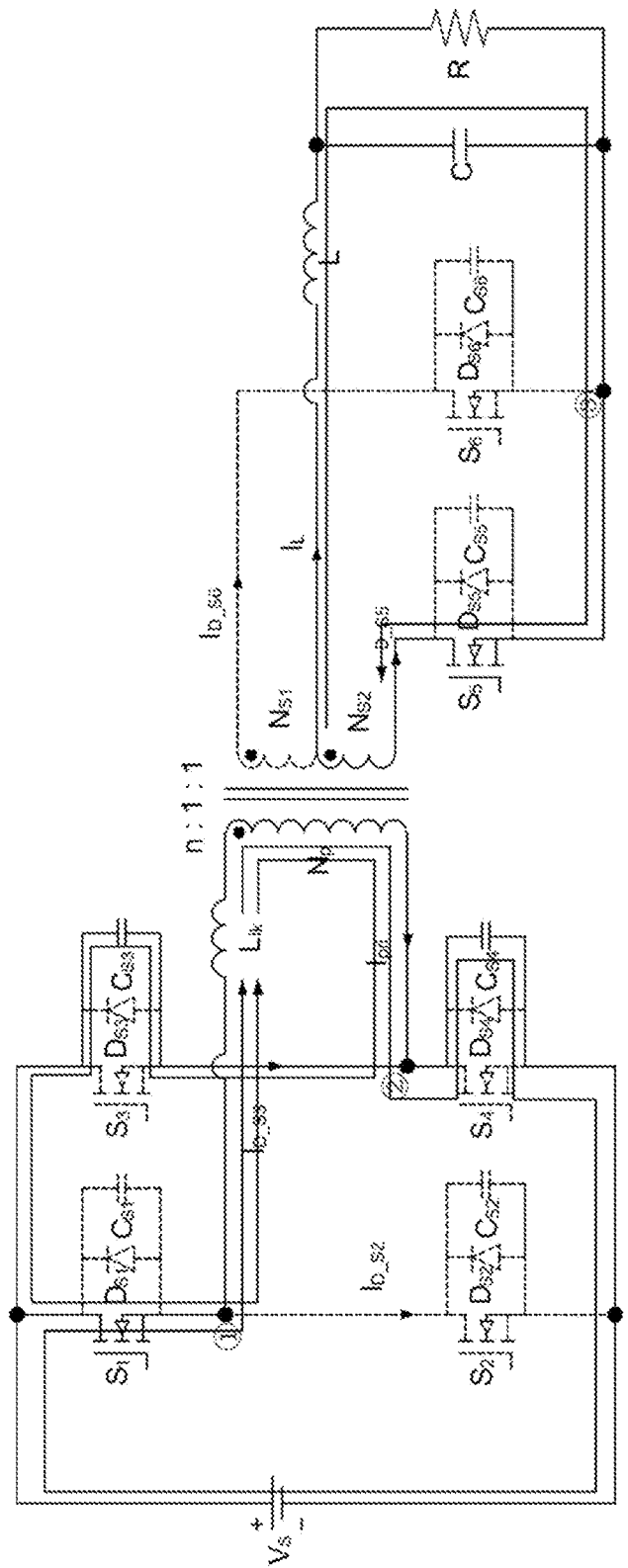

With reference to FIGS. 2 and 4, in a second operational mode during $t_2$ to $t_3$, the first switch $S_1$ maintains a turn-on state, the fourth switch $S_4$ is turned off at $t_2$, and the second switch $S_2$ and the third switch $S_3$ maintain a turn-off state, such that the fifth switch $S_5$ may maintain a turn-on state and the sixth switch $S_6$ may maintain a turn-off state.

In the second operational mode, the primary side of the transformer 220 forms resonant loops with the respective third and fourth switches $S_3$ and $S_4$, such that the fourth parasitic capacitor $C_{S4}$ connected in parallel with the fourth switch $S_4$ may be charged by the leakage inductance $L_{lk}$ and the third parasitic capacitor $C_{S3}$ connected in parallel with the third switch $S_3$ may be discharged.

Figure 5:
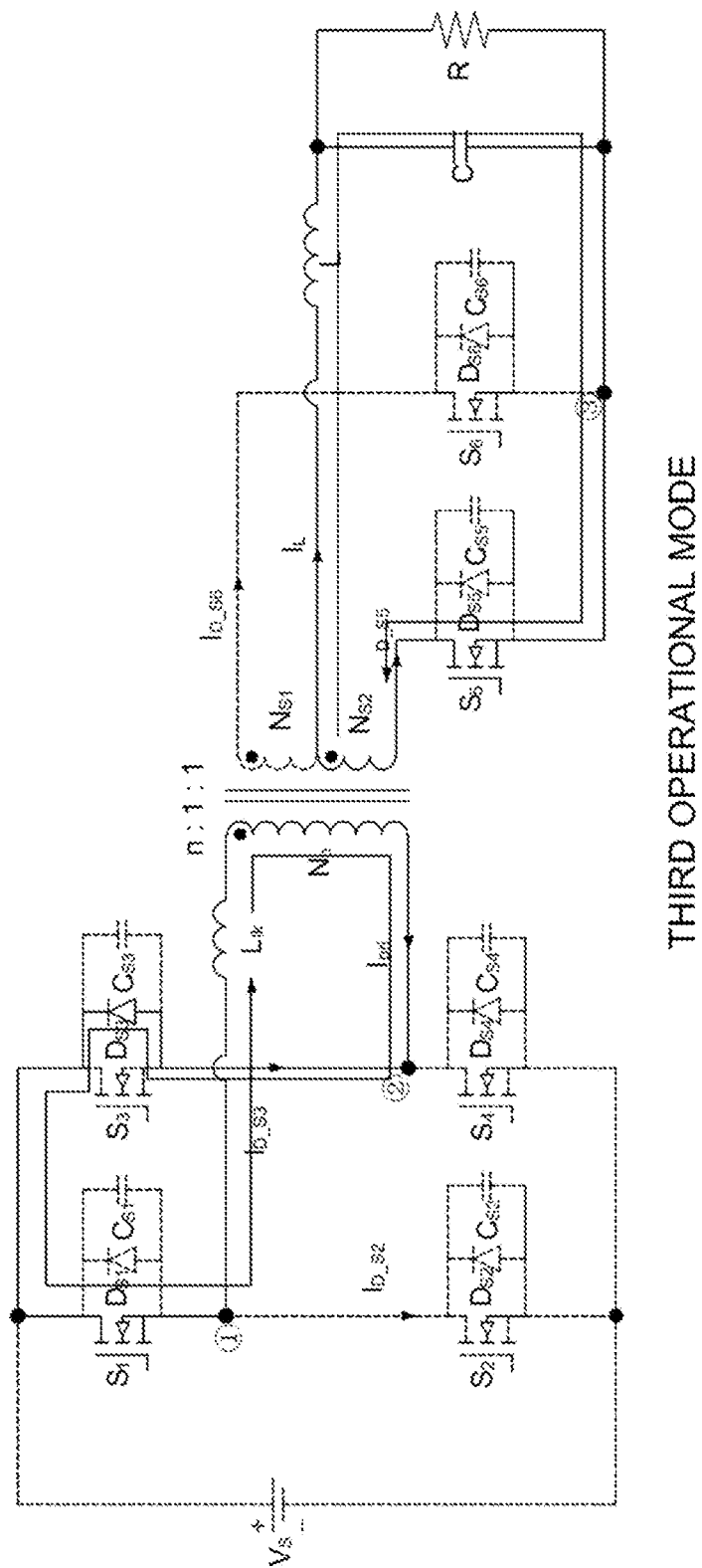

With reference to FIGS. 2 and 5, in a third operational mode during $t_3$ to $t_4$, the first switch $S_1$ maintains a turn-on state, and also the second switch $S_2$, the third switch $S_3$, and the fourth switch $S_4$ maintains a turn-off state, such that the fifth switch $S_5$ may maintain a turn-on state and the sixth switch $S_6$ may maintain a turn-off state.

In the third operational mode, if the third parasitic capacitor $C_{S3}$ connected in parallel with the third switch $S_3$ has been completely discharged, the third body diode $D_{S3}$ connected in parallel with the third switch $S_3$ is conducting and thus the primary-side current $I_{pri}$ of the transformer 220 may circulate through the first switch $S_1$ and the third body diode $D_{S3}$.

At this point, a conduction time of the third body diode $D_{S3}$ should be minimized so as to reduce an additional loss.

Figure 6:
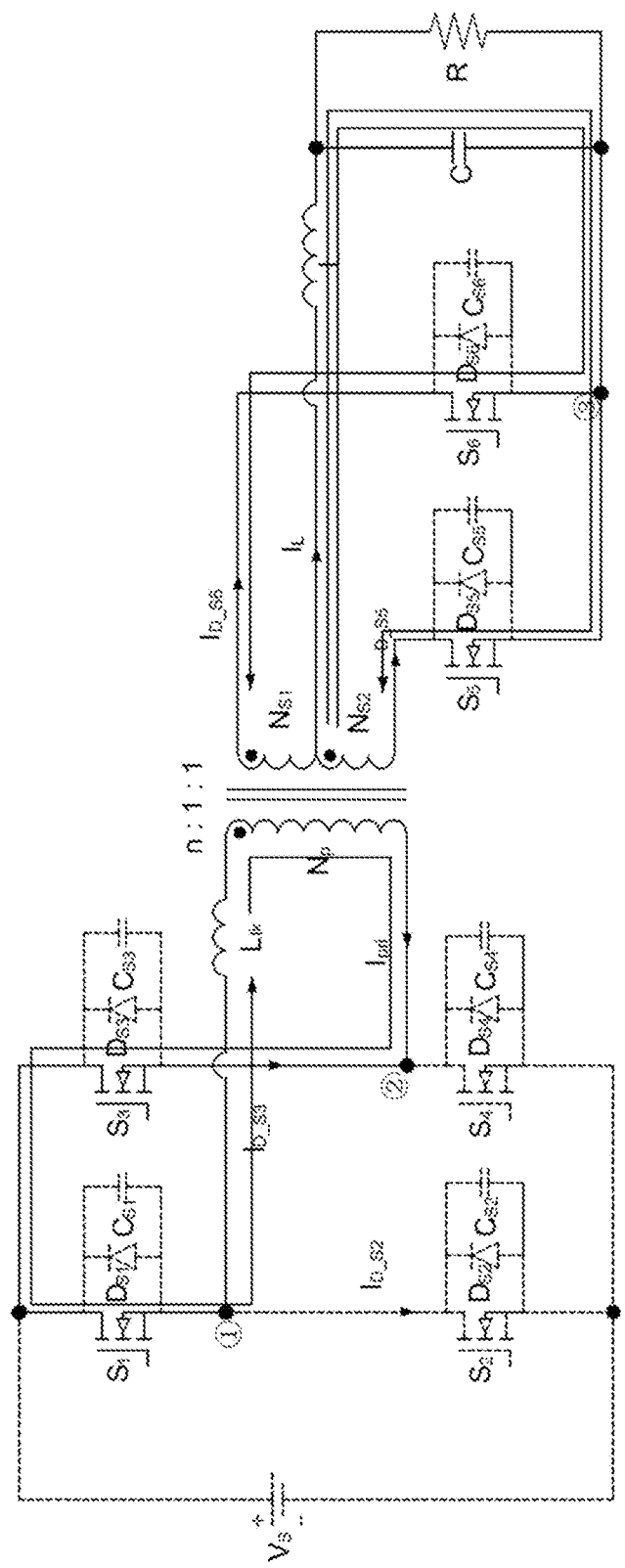

With reference to FIGS. 2 and 6, in a fourth operational mode during $t_4$ to $t_5$, the first switch $S_1$ maintains a turn-on state, the second switch $S_2$ and the fourth switch $S_4$ also maintain a turn-off state, and the third switch $S_3$ may be turned on at $t_4$. Consequently, the fifth switch $S_5$ may maintain a turn-on state and the sixth switch $S_6$ may also be turned on.

In the fourth operational mode, since a voltage of the third switch $S_3$ has a zero (0) value, the third switch $S_3$ may be turned on at $t_4$ by a ZVS. As a result, the primary-side current $I_{pri}$ of the transformer 220 may circulate through the third switch $S_3$ and the first switch $S_1$.

At this point, according to a voltage loss due to a parasitic resistance value on a circulation path and a decrease of a load current affecting the primary winding $N_P$, the primary-side current $I_{pri}$ of the transformer 220 may gradually reduce.

In addition, an output inductance L of the secondary side of the transformer 220 has a value greater than that of the leakage inductance $L_{lk}$ of the primary side thereof, such that a secondary-side current $I_L$ of the transformer 220 may vary relatively slower than the primary-side current $I_{pri}$ thereof.

Therefore, in order to balance magnetic flux of the transformer 220, a current according to Equation 1 may flow in the sixth switch $S_6$.

$$I_L = -(I_{DS5} + I_{DS6}) \qquad \text{[Equation 1]}$$

In Equation 1, $I_L$ denotes a current flowing in the output inductor 241, $I_{DS5}$ denotes a current flowing in the fifth switch $S_5$, and $I_{DS6}$ denotes a current flowing in the sixth switch $S_6$.

Figure 7:
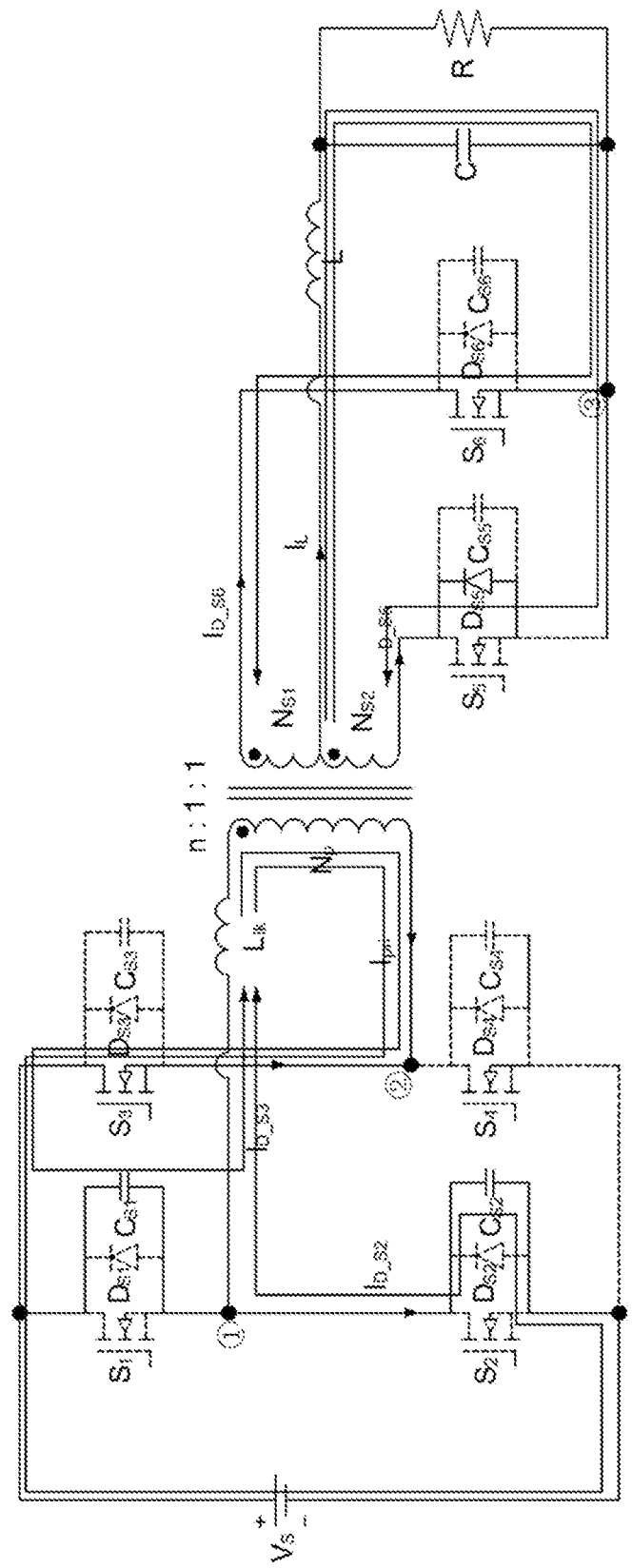

With reference to FIGS. 2 and 7, in a fifth operational mode during $t_5$ to $t_6$, the first switch $S_1$ is turned off at $t_5$, the second switch $S_2$ and the fourth switch $S_4$ maintain a turn-off state, and the third switch $S_3$ maintains a turn on state, such that the fifth switch $S_5$ may be turned off and the sixth switch $S_6$ may maintain a turn on state.

In the fifth operational mode, the primary side of the transformer 220 forms resonant loops with the respective first and second switches $S_1$ and $S_2$, such that the first parasitic capacitor $C_{S1}$ connected in parallel with the first switch $S_1$ may be charged by the leakage inductance $L_{lk}$ and the second parasitic capacitor $C_{S2}$ connected in parallel with the second switch $S_2$ may be discharged.

At this point, the primary-side current $I_{pri}$ of the transformer 220 may reduce according to Equation 2.

$$\frac{\Delta I}{\Delta t} = (V_s - V_{c2}) L_{lk} \qquad \text{[Equation 2]}$$

In Equation 2, $\Delta I/\Delta t$ denotes a variation amount of the primary-side current $I_{pri}$ of the transformer 220 according to a time, and $V_S$, $V_{c2}$, and $L_{lk}$ denote an input voltage, a voltage of the second parasitic capacitor $C_{S2}$, and the leakage inductance, respectively.

Also, in the secondary-side of the transformer 220, the fifth body diode $D_{S5}$ connected in parallel with the fifth switch $S_5$ is conducting according to a turn-off operation of the fifth switch $S_5$, such that the current $I_{DS5}$ flowing in the fifth switch $S_5$ may decrease and the current $I_{DS6}$ flowing in the sixth switch $S_6$ may increase according to Equation 1.

Figure 8:
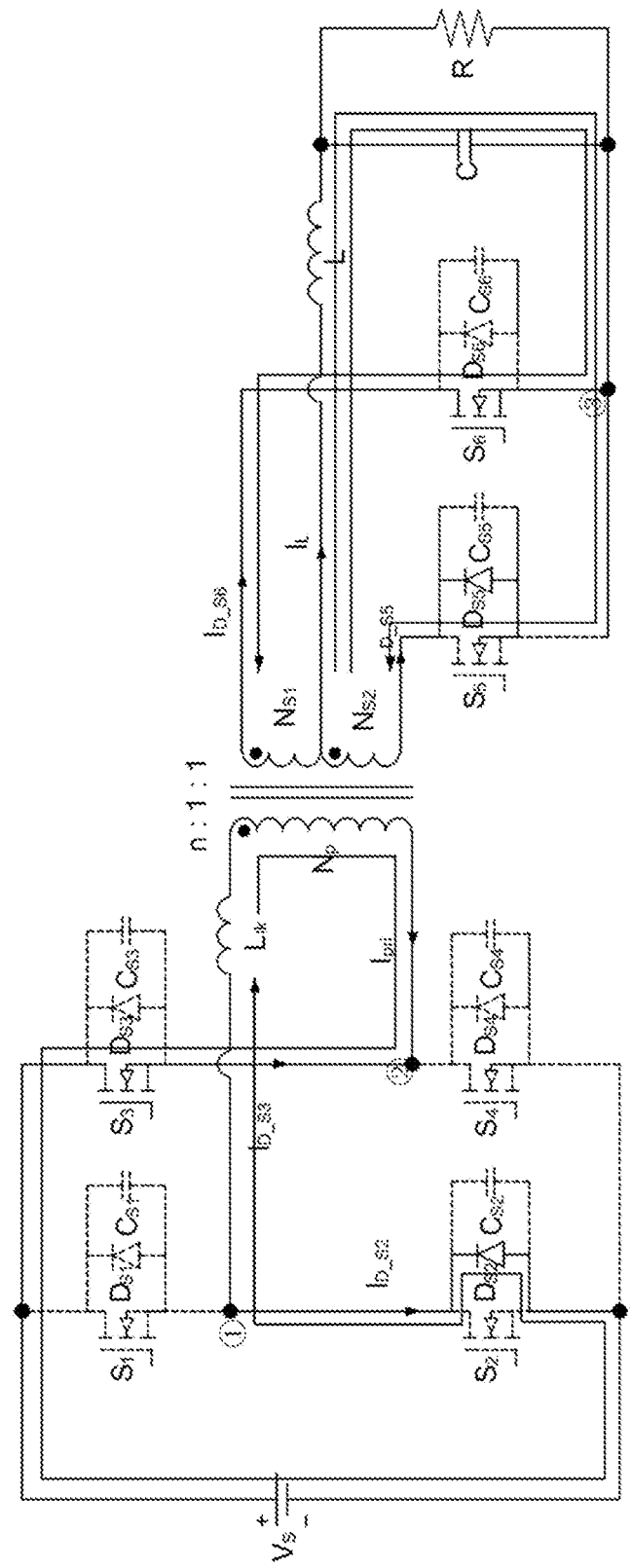

Thereafter, with reference to FIGS. 2 and 8, in a sixth operational mode during $t_6$ to $t_7$, the first switch $S_1$ to the sixth switch $S_6$ may maintain states the same as those in the fifth operational mode.

In the sixth operational mode, if the second parasitic capacitor $C_{S2}$ connected in parallel with the second switch $S_2$ has been completely discharged, the second body diode $D_{S2}$ connected in parallel with the second switch $S_2$ is conducting and thus the primary-side current $I_{pri}$ of the transformer 220 may circulate through the third switch $S_3$ and the second body diode $D_{S2}$.

At this point, a conduction time of the second body diode $D_{S2}$ may also be minimized so as to reduce an additional loss.

Figure 9:
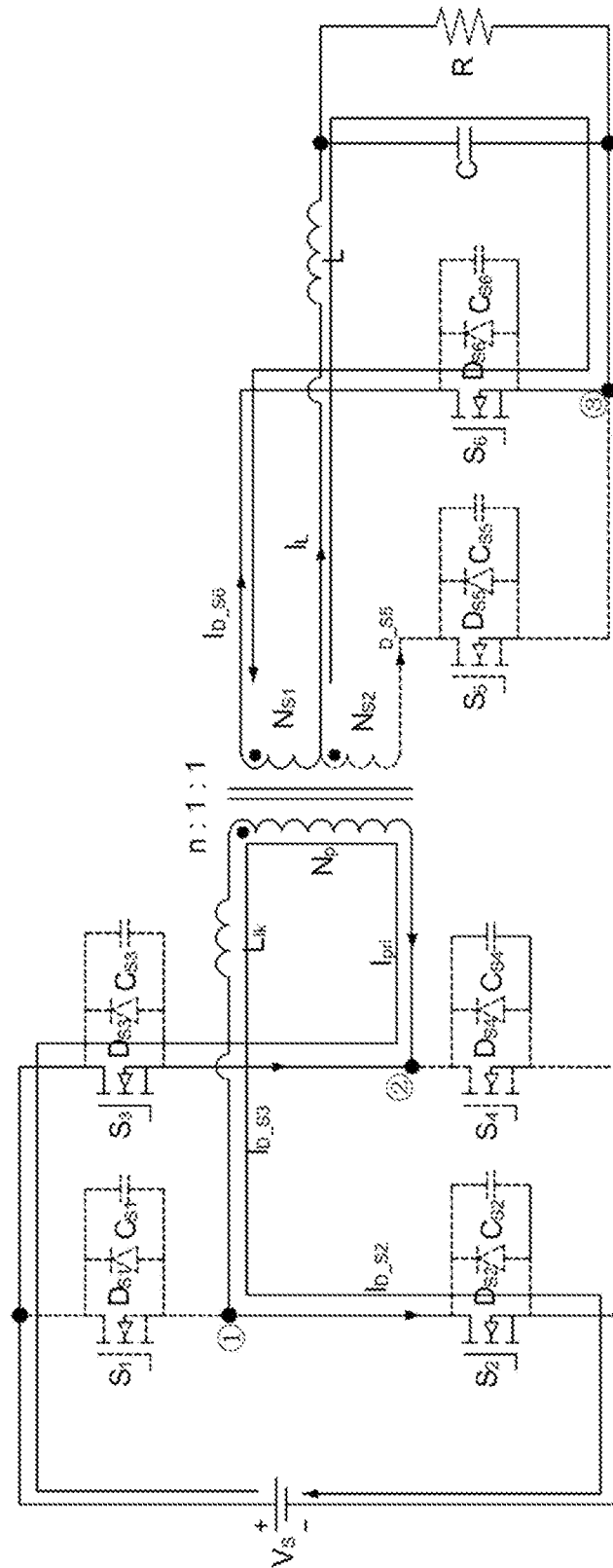

With reference to FIGS. 2 and 9, in a seventh operational mode during $t_7$ to $t_8$, the first switch $S_1$ and the fourth switch $S_4$ maintain a turn-off state, the third switch $S_3$ maintains a turn-on state, and the second switch $S_2$ may be turned on at $t_7$.

In the seventh operational mode, since a voltage of the second switch $S_2$ has a zero (0) value, the second switch $S_2$ may be turned on at $t_7$ by a ZVS. Consequently, a direction of a flow of the primary-side current $I_{pri}$ of the transformer 220 may be changed.

Also, in the secondary side of the transformer 220, the current $I_{DS5}$ flowing in the fifth switch $S_5$ has a zero (0) value, so that the fifth body diode $D_{S5}$ may be non-conducting.

With such an operation, the charger 200 according to one embodiment of the present disclosure may charge the battery 300 through the CC/CV charge method, and it may be preferable to charge the battery 300 using the input power supply 100 and the charger 200 having a specification of Table 1, but it is not limited thereto.

TABLE 1

| Input voltage | $V_i$ | 400 V |
|---|---|---|
| Output voltage | $V_a$ | 56.4 V |
| Rated power | $P_o$ | 3000 W |
| Switching frequency | $f_s$ | 60 kHz |
| Output capacitor | C | 3000 μF |
| Output of inductor | L | 100 μH |
| Transformer ratio | $N_p:N_s$ | 25:5 |
| Leakage inductance | $L_{lk}$ | 25 μH |
| Parameters of lead-acid battery for electric forklift | | |
| Capacity | Q | 365 Ah |
| Nominal voltage | $V_{nom}$ | 48.0 V |
| Maximum voltage | $V_{max}$ | 42.0 V |
| Minimum voltage | $V_{min}$ | 56.4 V |
| Equivalent capacitance of the battery | $C_b$ | 91250 F |
| Equivalent series resistance of the battery | $R_b$ | 118 mΩ |

Figure 10:
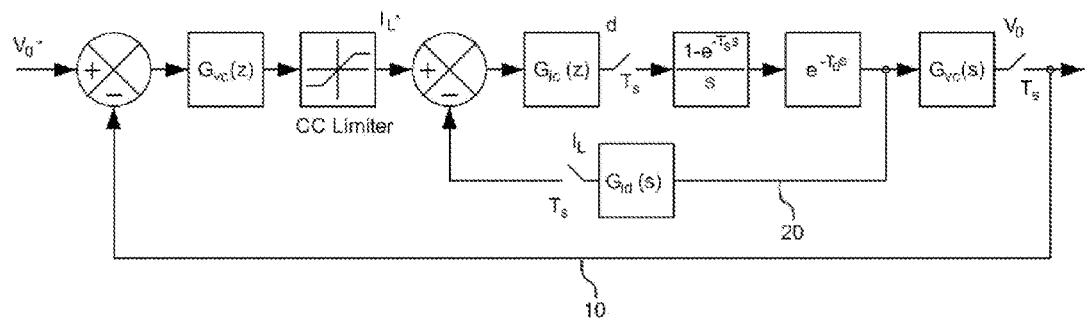
FIG. 10 is a control block diagram for a constant-current and constant-voltage (CC/CV) charge of the charger according to one embodiment of the present disclosure.

Meanwhile, FIG. 10 is a control block diagram for a CC/CV charge of the charger according to one embodiment of the present disclosure.

With reference to FIG. 10, the charger 200 according to one embodiment of the present disclosure may charge the battery 300 through a double loop control in a CC/CV charge method.

The CC/CV charge method is a method in which the battery 300 is charged with a constant current and then, when a voltage of the battery 300 reaches a predetermined value, is charged with a constant voltage, thereby being completely charged when the charge current gradually reduces to be a microcurrent.

Therefore, a dual loop for the CC/CV charge may be comprised of a voltage loop 10 for controlling a CV mode and a current loop 20 for controlling a CC mode.

Meanwhile, a transfer function of the current output to the battery 300 through the output inductor 241 is expressed as Equation 3.

$$G_{id} = \frac{nV_S}{\frac{Z_b L C s^2 + L s + Z_b}{1 + s Z_b C} + R_d}$$ [Equation 3]

In Equation 3, $G_{id}$ denotes a control-to-output current transfer function, n denotes the turn ratio of the transformer 220, $V_S$ denotes the input voltage, L denotes an inductance of the output inductor 241, C denotes a capacitance of the output capacitor 242, and s denotes a Laplace variable. In addition, $R_d$ is a value satisfying $R_d=4n^2 L_{lk} f_s$ and $Z_b$ is a value satisfying $Z_b = R_b + 1/(sC_b)$, wherein n denotes the turns ratio of the transformer 220, $L_{lk}$ denotes the leakage inductance, $f_s$ denotes a switching frequency, $R_b$ denotes a resistance of the battery 300, and $C_b$ denotes a capacitance of the battery 300.

Also, a transfer function of an output voltage of the battery 300 is expressed as Equation 4.

$$G_{vd} = \frac{nV_S}{s^2 LC + s\left(\frac{L}{Z_b} + R_d C\right) + \frac{R_d}{Z_b} + 1}$$ [Equation 4]

In Equation 4, $G_{vd}$ denotes a control-to-output voltage transfer function, n denotes the turns ratio of the transformer 220, $V_S$ denotes the input voltage, L denotes the inductance of the output inductor 241, C denotes the capacitance of the output capacitor 242, and s denotes a Laplace variable. In addition, $R_d$ is a value satisfying $R_d=4n^2 L_{lk} f_s$ and $Z_b$ is a value satisfying $Z_b = R_b + 1/(sC_b)$, wherein n denotes the turns ratio of the transformer 220, $L_{lk}$ denotes the leakage inductance, $f_s$ denotes the switching frequency, $R_b$ denotes the resistance of the battery 300, and $C_b$ denotes the capacitance of the battery 300.

At a point of view of Equation 3, a bandwidth of the current loop 20 may be selected as, for example, 3 kHz that is 1/20 of the switching frequency of Table 1, and a bandwidth of the voltage loop 10 may be selected as, for example, 300 Hz that is 1/10 of the bandwidth of the current loop 20.

As a result, with limitations of Table 1, the transfer function of the current loop 20 calculated using Equation 3 may be set as Equation 5, and the transfer function of the voltage loop 10 calculated using Equation 4 may be set as Equation 6.

However, it is noted that Equations 5 and 6 are provided for exemplary purposes only and it is not limited thereto.

$$G_{ic}(z) = \frac{0.23528z - 0.0221}{z - 1}$$ [Equation 5]

$$G_{vc\_CCCV}(z) = \frac{5.44z - 5.22360}{z - 1}$$ [Equation 6]

In Equations 5 and 6, $G_{ic}(z)$ denotes a discrete transfer function of a current PI controller for the CC/CV charge of the current loop 20, and $G_{vc\_CCCV}(z)$ denotes a discrete transfer function of a voltage PI controller for the CC/CV charge of the voltage loop 10.

In the charger 200 according to one embodiment of the present disclosure, a separate controller (not shown) including a digital signal processor may control the charger 200 according to such a dual loop control to charge the battery 300 in the CC/CV charge method.

Meanwhile, when the input power supply 100, the charger 200, and the battery 300 have the specifications in Table 1, an idle time may be given if a charge of the battery 300 is completed in the CC/CV charge method. At this point, in order to perform the EIS, a separate controller (not shown) including a digital signal processor may generate a perturbation voltage by adding a voltage in the form of a sine wave to an open circuit voltage $V_{oc}$ of the charger 200 as Equation 7, thereby applying the generated perturbation voltage to the battery 300.

$$V=V_{oc}+\Delta V=V_{oc}+V_m \sin \omega t \quad \text{[Equation 7]}$$

In Equation 7, V denotes the perturbation voltage, $V_{oc}$ denotes the open circuit voltage of the charger 200, $\Delta V$ denotes an output voltage ripple, and $V_m$ denotes a peak value of a perturbation voltage.

As described above, under the control of a separate controller including a digital signal processor, the charger 200 may apply the perturbation voltage to the battery 300 to induce a response current output thereof as Equation 8.

$$\Delta I=I_m \sin(\omega t-\varphi) \quad \text{[Equation 8]}$$

In Equation 8, $\Delta I$ denotes a response current, $\varphi$ denotes a phase angle between the response current and the perturbation voltage, and $I_m$ denotes a peak value of the response current.

At this point, according to the perturbation voltage and the response current, an impedance of the battery 300 may be calculated as Equation 9.

$$Z(\omega)=\frac{\Delta V}{\Delta I}=\frac{V_m}{I_m}e^{j\varphi} \quad \text{[Equation 9]}$$

In Equation 9, $Z(\omega)$ denotes the impedance of the battery 300 and $V_m$ denotes the peak value of the perturbation voltage. In addition, $I_m$ denotes the peak value of the response current and $\varphi$ denotes the phase angle between the response current and the perturbation voltage.

According to Equation 9, it can be seen that the impedance of the battery 300 is a parameter depending on a frequency. In other words, the impedance of the battery 300 may be specified by a real part and an imaginary part, or a coefficient and a phase.

Therefore, in order to prevent a distortion of the perturbation voltage while the impedance of the battery 300 is measured, it may be preferable to measure the impedance of the battery 300 in the range of 0.1 Hz to 1 kHz according to the embodiment of the present disclosure, but it is not limited thereto.

Afterward, the charger 200 may generate an equivalent circuit of the battery 300 using the impedance thereof to diagnose a state-of-health thereof according to Equation 10.

$$SOH_{arbitrary} \left| \frac{R_s^{selected}-R_s^{aged}}{R_s^{fresh}-R_s^{aged}} \right| \quad \text{[Equation 10]}$$

In Equation 10, $$SOH_{arbitrary}$$

denotes a State-Of-Health (SOH) of an arbitrary battery 300, $R_s^{selected}$ denotes an ohmic resistance of a battery under test, $R_s^{aged}$ denotes an ohmic resistance of an aged battery, and $R_s^{fresh}$ denotes an ohmic resistance of a fresh battery.

In other words, the charger 200 may calculate an impedance spectrum according to the response current of the battery 300 and select an equivalent circuit model thereof according to the calculated impedance spectrum. Here, the equivalent circuit model may be modeled by a known Randles equivalent circuit.

Figure 11:
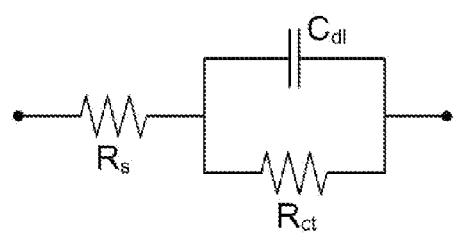
FIG. 11 is a schematic circuit diagram illustrating an equivalent circuit of a battery according to one embodiment of the present disclosure.

FIG. 11 is a schematic circuit diagram illustrating an equivalent circuit of the battery according to one embodiment of the present disclosure.

With reference to FIG. 11, an equivalent circuit of the battery 300 may be comprised of two resistors $R_s$ and $R_{ct}$ and one capacitor $C_{dl}$.

Thereafter, the charger 200 may calculate an impedance parameter from the equivalent circuit of the battery 300 using a known nonlinear complex least-squares fitting method and apply the calculated impedance parameter of the battery 300 to Equation 10, thereby diagnosing a state-of-health of the battery 300.

Although the embodiments have been described with reference to a number of illustrative embodiments thereof, it should be understood that numerous other modifications and embodiments can be devised by those skilled in the art that will fall within the spirit and scope of the principles of this disclosure. The embodiments disclosed herein, therefore, are not to be taken in a sense for limiting the technical concept of the present disclosure but for explanation thereof, and the range of the technical concept is not limited to these embodiments. The scope of the present disclosure should be construed by the appended claims, along with the full range of equivalents to which such claims are entitled.

What is claimed is:

1. A charger having a battery diagnosis function, wherein the charger is connected between an input power supply supplying an input voltage and a battery and charges the battery with the input voltage, the charger comprising:
   a full-bridge-circuit connected to the input power supply and comprising a first switch, a second switch, a third switch, and a fourth switch;
   a transformer comprising a primary winding and a secondary winding, wherein the primary winding is connected to the full-bridge-circuit to transform the input voltage received from the full-bridge-circuit and transmits the voltage to the secondary winding; and
   a rectifying circuit comprising a fifth switch and a sixth switch, connected between the secondary winding and the battery, and rectifying the voltage received from the transformer to charge the battery, or transmitting power in two directions for diagnosing a state-of-health of the battery.

2. The charger of claim 1, further comprising:
   a controller controlling the first, the second, the third, the fourth, the fifth, and the sixth switches to charge the battery with the input voltage or applying a perturbation voltage for diagnosing the state-of-health of the battery, and diagnosing the state-of-health of the battery based on a response current output from the battery in response to the perturbation voltage.

3. The charger of claim 1, wherein the full-bridge-circuit comprises a first leg and a second leg connected in parallel with each other, and wherein the first switch and the second switch are coupled to the first leg, and the third switch and the fourth switch are coupled to the second leg.

4. The charger of claim 1, wherein each of the first, the second, the third, and the fourth switches comprises a parasitic capacitor and a body diode, which are connected in parallel to each other.

5. The charger of claim 1, wherein the transformer comprises a tap in the secondary winding.

6. The charger of claim 5, further comprising a smoothing circuit connected to the tap in the secondary winding.

7. The charger of claim 1, wherein the rectifying circuit comprises:
the sixth switch connected to one end of the secondary winding; and
the fifth switch connected to the other end of the secondary winding.

8. The charger of claim 1, wherein each of the fifth switch and the sixth switch comprises a parasitic capacitor and a body diode, which are connected in parallel to each other.

9. The charger of claim 1, wherein each of the first, the second, the third, and the fourth switches is turned on by a zero voltage switching (ZVS).

10. The charger of claim 2, wherein an impedance of the battery is calculated according to the following equation:

$$Z(\omega) = \frac{\Delta V}{\Delta I} = \frac{V_m}{I_m} e^{j\varphi},$$

wherein $Z(\omega)$ denotes the impedance of the battery, $V_m$ denotes a peak value of the perturbation voltage, $I_m$ denotes a peak value of the response current, and $\varphi$ denotes a phase angle between the response current and the perturbation voltage, wherein an equivalent circuit of the battery using the impedance to diagnose a state-of-health is obtained according to the following equation:

$$SOH_{arbitrary} \left| \frac{R_s^{selected} - R_s^{aged}}{R_s^{fresh} - R_s^{aged}} \right|,$$

wherein $SOH_{arbitrary}$ denotes a State-Of-Health (SOH) of the battery, $R_s^{seleced}$ denotes an ohmic resistance of the battery, $R_s^{aged}$ denotes an ohmic resistance of an aged battery, and $R_s^{fresh}$ denotes an ohmic resistance of a fresh battery.

11. The charger of claim 10, wherein the charger calculates an impedance spectrum according to the response current of the battery and according to the impedance spectrum, the charger selects an equivalent circuit model.

* * * * *